United States Patent Office 3,390,024

Patented June 25, 1968

3,390,024

FLUX FOR FUSING TIN TO GALLIUM ARSENIDE AND METHOD OF MAKING AND USING SAME

Alfred J. Stein, Jr., Dallas, Tex., assignor to Texas Instruments Incorporated, Dallas, Tex., a corporation of Delaware No Drawing. Filed Mar. 11, 1965, Ser. No. 439,103

3 Claims. (Cl. 148—182)

ABSTRACT OF THE DISCLOSURE

Disclosed is a flux of stannous chloride for use when fusing tin with gallium arsenide which causes the tin to uniformly wet the gallium arsenide surface. The stannous chloride flux may be applied to tin spheres for forming alloy functions by immersing the spheres in a solution of hydrochloric acid. Anhydrous stannous chloride may also be evaporated onto the exposed gallium arsenide surface prior to the deposition of tin thereon.

This invention relates to fusing tin to gallium arsenide, and more particularly to a flux which aids in the uniform wetting and fusing of tin to gallium arsenide and to methods of making same.

Tin and alloys of tin have been used in the past for making ohmic contact to N-type gallium arsenide and rectifying contacts to P-type gallium arsenide. Such contacts are usually made by placing a small sphere or pellet of tin on the surface of a gallium arsenide body and rapidly heating the gallium arsenide to a temperature at which the tin melts and fuses with the gallium arsenide. The gallium arsenide is then allowed to cool rapidly, the molten portion adjacent the tin pellet recrystallizing in the crystalline orientation of the body but being saturated with tin. This tin saturated region is generally known as the "regrowth region" and, being saturated with tin, is highly doped N-type. The tin pellet is consequently bonded to the gallium arsenide body through the above described alloying process, and since tin is generally known as an N-type dopant in gallium arsenide, the alloyed contact is ohmic to N-type material and rectifying to P-type material.

The uniformity and reproducibility of alloyed contacts such as described above is of extreme importance in the production of rectifying contacts to gallium arsenide. For example, gallium arsenide diodes may be formed by alloying tin to a P-type gallium arsenide body, the tin saturated regrowth region providing the N-type portion of a P-N junction device. However, it has been observed that regrowth regions formed by fusing tin spheres to gallium arsenide are extremely irregular and non-reproducible, the irregularity and non-reproducibility being generally attributed to poor wetting of the gallium arsenide surface by molten tin. The poor wetting characteristics of tin are generally believed to be caused by a thin layer of tin oxide which forms on tin exposed to air. Since the molten tin does not uniformly wet the gallium arsenide surface, the regrowth region is irregularly shaped; consequently the interface between the original gallium arsenide and the regrowth region is irregular and of varying depth. The problem becomes even more acute when the above-described process is used to form an alloyed emitter for an N-P-N gallium arsenide transistor, since the tin must be alloyed into a very thin layer of P-type gallium arsenide. The regrowth region thus provides the emitter of the gallium arsenide transistor and must be of a uniform depth and parallel to the collector-base junction. Irregular and non-uniform regrowth regions as described above ordinarly form poor emitter regions and frequently extend through the P-type region into the collector region, thus making the transistor inoperative.

It is therefore a primary object of the present invention to provide a flux for uniformly fusing tin with gallium arsenide. Other objects and advantages of the invention include a process for coating tin spheres with a layer of flux which aids tin in uniformly wetting gallium arsenide surfaces to provide tin saturated regrowth regions of regular shape and uniform depth. A particular object is to provide a method of fusing tin to a P-type gallium arsenide layer to form an N-type regrowth region which may be used as an emitter for a gallium arsenide N-P-N transistor.

In accordance with this invention, a flux of stannous chloride ($SnCl_2$) is used when fusing tin with gallium arsenide. The flux causes the tin to uniformly wet the gallium arsenide surface, thus allowing the tin sphere to spread and flow in a regular, reproducible pattern. Furthermore, since the tin uniformly wets the surface of the gallium arsenide, the tin fuses to a uniform depth, the boundary of the regrowth region being planar and parallel to the surface of the gallium arsenide body.

The stannous chloride flux may be formed and uniformly applied to tin spheres by the following process: High purity tin spheres are first washed in a suitable organic solvent such as toluene or acetone. The tin is then washed with distilled water and placed in a container in an aqueous solution of about 10% hydrochloric acid. The hydrochloric acid solution uniformly attacks the surface of each of the tin spheres and forms a thin layer of stannous chloride thereon. The stannous chloride coated tin spheres may then be used as needed directly from the solution of hydrochloric acid.

Stannous chloride coated tin spheres of about 2 mil diameter treated as described above have been used to form reproducible uniform alloy junctions in gallium arsenide by placing the coated tin sphere on the surface of the gallium arsenide wafer and heating the wafer to a temperature of about 500° C. The tin uniformly fused with the gallium arsenide to form a tin saturated regrowth region approximately 1.5 microns deep.

Stannous chloride may also be used as a flux for forming evaporated contacts. In the normal process for producing evaporated contacts, the contact material is evaporated onto a gallium arsenide surface through selectively formed openings in a mask. To be effective, the flux must be at the Sn-GaSn interface and thus must be deposited on the gallium arsenide surface prior to the deposition of tin. It has been found that unless stannous chloride is free from water, it evaporates violently when rapidly heated. Thus water must be carefully removed from the flux prior to evaporation. In accordance with this phase of the invention, high purity stannous chloride is heated to approximately 120° to remove water and hydrochloric acid therefrom, and to convert any stannic chloride therein to stannous chloride. Anhydrous stannous chloride thus prepared must be stored in a dry atmosphere until used to avoid the formation of $SnCl_2 \cdot 2H_2O$.

Anhydrous stannous chloride prepared as above may be uniformly deposited on a partially masked gallium arsenide surface by conventional vacuum evaporation techniques. The anhydrous stannous chloride is unformly evaporated when heated to about 600–700° C. A thin layer of the flux, approximately 5,000 angstrom units thick, deposited on the exposed gallium arsenide surface prior to the deposition of tin thereon, aids in the formation of a uniform and reproducible regrowth region as described above.

While the invention has been described with reference to two specific embodiments thereof, other advantages and features of the invention will become readily apparent to those skilled in the art. It is to be understood that the form of this invention, herewith described, is to be taken as a preferred example of the same, and that various changes may be resorted to without departing from the spirit and scope of the invention as defined by the appended claims.

What is claimed is:

1. In the process of fusing tin bodies to gallium arsenide, the step of forming a coating of stannous chloride on said tin bodies prior to fusing.

2. The process according to claim 1 wherein said tin bodies are immersed in an aqueous solution in about 10% hydrochloric acid for a time sufficient to form a thin coating of stannous chloride thereon.

3. In the process of fusing tin to selected portions of a surface of gallium arsenide wherein said tin is deposited on said selected portions of said surface by evaporation through windows in a mask, the step of evaporating anhydrous stannous chloride onto the gallium surface exposed through said mask prior to the deposition of tin thereon.

References Cited

UNITED STATES PATENTS 2,887,416 5/1959 Van Amstel ---------- 148—182

FOREIGN PATENTS 917,727 2/1963 Great Britain.

HYLAND BIZOT, *Primary Examiner.*

DAVID L. RECK, *Examiner.*

H. F. SATIO, W. W. STALLARD, *Assistant Examiners.*